United States Patent
Shen

[11] Patent Number: 6,025,268
[45] Date of Patent: Feb. 15, 2000

[54] METHOD OF ETCHING CONDUCTIVE LINES THROUGH AN ETCH RESISTANT PHOTORESIST MASK

[75] Inventor: Lewis N. Shen, Cupertino, Calif.

[73] Assignee: Advanced Micro Devices, Inc., Sunnyvale, Calif.

[21] Appl. No.: 08/669,740

[22] Filed: Jun. 26, 1996

[51] Int. Cl.⁷ ................................................ H01L 21/321
[52] U.S. Cl. ...................... 438/669; 438/696; 438/742; 216/41; 216/49; 216/48
[58] Field of Search .................................... 430/313, 316, 430/323; 438/690, 695, 696, 669, 742; 216/41, 49, 48

[56] References Cited

U.S. PATENT DOCUMENTS

| | | | |
|---|---|---|---|
| 4,613,400 | 9/1986 | Tam et al. | 216/49 |
| 4,678,540 | 7/1987 | Uchimura | 156/643 |
| 4,741,799 | 5/1988 | Chen et al. | 156/643 |
| 4,948,462 | 8/1990 | Rossen | 156/643 |
| 4,957,834 | 9/1990 | Matsuda et al. | 430/5 |
| 5,106,786 | 4/1992 | Brady et al. | 430/313 |
| 5,112,761 | 5/1992 | Matthews | 437/31 |
| 5,182,235 | 1/1993 | Eguchi | 437/238 |
| 5,227,341 | 7/1993 | Kamide et al. | 438/742 |
| 5,266,157 | 11/1993 | Kadomura | 216/41 |
| 5,314,576 | 5/1994 | Kadomura | 156/643 |
| 5,441,915 | 8/1995 | Lee | 437/195 |
| 5,449,639 | 9/1995 | Wei et al. | 437/187 |
| 5,459,093 | 10/1995 | Kuroda et al. | 437/195 |

FOREIGN PATENT DOCUMENTS

| | | |
|---|---|---|
| 0 123 813 A3 | 11/1984 | European Pat. Off. . |
| 0 334 525 A1 | 9/1989 | European Pat. Off. . |
| 0 573 212 A2 | 12/1993 | European Pat. Off. . |
| 0 622 477 A1 | 11/1994 | European Pat. Off. . |
| 07094467 | 4/1995 | European Pat. Off. . |
| 2716419 | 11/1977 | Germany . |
| 1052142 | 2/1989 | Japan . |
| WO 94/12912 | 6/1994 | WIPO . |

OTHER PUBLICATIONS

"Silicon Processing for the VLSI Era Vol. 1: Process Technology," Wolf et al., Lattice Press, pp. 565–567.

Primary Examiner—Maria Nuzzolillo
Assistant Examiner—Laura Weiner

[57] ABSTRACT

A passivation coating is formed on a photoresist mask to increase the resistance of the mask during subsequent etching of an underlying conductive layer to form a pattern of sub-half micron conductive lines. In an embodiment of the invention, the passivation coating is formed by exposing the mask to a plasma containing nitrogen. The passivating coating maintains the substantially vertical mask profile during subsequent etching, such as high density plasma etching, thereby improving the dimensional integrity of the sub-half micron conductive lines.

19 Claims, 3 Drawing Sheets

METHOD OF ETCHING CONDUCTIVE LINES THROUGH AN ETCH RESISTANT PHOTORESIST MASK

TECHNICAL FIELD

The present invention relates to a method of manufacturing a semiconductor device wherein a conductive layer is etched through a photoresist mask to form accurately dimensioned conductive lines. The invention is particularly applicable to submicron circuitry employing high density plasma etching.

BACKGROUND ART

The escalating requirements for high density and performance associated with ultra large scale integration require responsive changes in conductive patterns, which is considered one of the most demanding aspects of ultra large scale integration technology. High density demands for ultra large scale integration semiconductor wiring require increasingly denser arrays with narrower conductive lines and reduced spacing between conductive lines. This objective becomes particularly difficult to achieve given the economic pressure for high speed production with existing equipment. Thus, the combined requirements of high speed and high density conductive wiring patterns pose a challenge which, to date, has not been satisfactorily met.

The ever increasing demands for semiconductor devices containing conductive patterns having increasingly narrower line widths and increasingly narrower interwiring spacing therebetween generate acute problems particularly with respect to current photolithographic capabilities. For example, photolithographic production equipment, called i-line steppers, employs an ultra-violet (UV) source having a wave length of about 0.365 µm. However, as the requirement for conductive line widths and interwiring spacing decreases to below about 0.5 µm, particularly below 0.40 µm, such i-line stepper equipment is pressed to the limit of its capability. The considerable investment in such i-line stepper equipment creates an economic incentive to satisfy the ever increasing demands for smaller interwiring spacing and narrower conductive lines without replacing existing i-line stepper equipment.

A conventional method of forming a pattern of conductive lines comprises a subtractive etch back step as the primary metal-patterning technique. This traditional technique basically comprises forming an insulating layer, as on a semiconductor substrate, typically monocrystalline silicon, and depositing a conductive layer on the insulating layer. The conductive layer can comprise aluminum, an aluminum alloy, tungsten, polysilicon, tungsten silicide, or titanium silicide. A photoresist mask is then formed on the conductive layer, by conventional photolithographic techniques. The photoresist mask defines a pattern of conductive lines for substantial reproduction in the conductive layer. The conductive pattern is then formed in the conductive layer by etching through the photoresist mask.

Typically, etching is conducted to optimize production speed, as by utilizing an etching apparatus which generates a high density plasma, e.g., a high density chlorine plasma. Such a high density plasma etching technique comprises feeding chlorine gas, along with boron trichloride, into an etching apparatus, such as a Transformer Coupled Plasma (TCP) source type of apparatus to generate a high density plasma with Cl⁻ as the etching species. Model 9600, commercially available from Lam Research Corp., Fremont, Calif., has been found suitable. Other types of etching apparatus, such as other high density plasma source types of apparatus, can be used. For example, etching can also be conducted with an Electron Cycletron Resonance (ECR) type apparatus, a Helicon Resonant Inductive coupled plasma source type apparatus or a Decoupled Plasma Source (DPS) type of apparatus.

Etching is normally conducted until the conductive material, typically a metal, is substantially removed between the metal lines along with any residues which may have formed. Overetching is conventionally performed to remove a portion of the underlying oxide to ensure complete removal of products between the metal lines.

In order to efficiently manufacture semiconductor devices having a conductive pattern with accurately and reproducibly formed conductive lines having a width and interwiring spacing of about 0.5 µm or less, particularly below 0.40 µm, it is necessary to employ a photoresist mask which is very thin to ensure an adequate process margin, i.e., an adequate depth of focus. Unfortunately, the etch selectivity to conventional photoresist materials when etching an underlying conductive layer, such as a metal, is not sufficiently high to avoid lateral etching of the side surfaces of the pattern defined in the photoresist mask. Consequently, during etching of the underlying metal to form a conductive pattern, as by high density plasma etching, the profile of the photoresist mask pattern is disadvantageously altered resulting in undercutting of the metal lines with a consequential reduction in the width of the metal lines. Any such reduction in the width of a metal line below the design rule significantly affects line integrity and, hence, the performance of the resulting semiconductor device. Thus, in order to accurately and reproducibly form conductive patterns with sub-half micron geometry employing conventional i-line stepper equipment, new approaches are required.

A conventional etching process to form a conductive pattern is illustrated in FIGS. 1–3. As shown in FIG. 1, insulating layer 10, such as an oxide layer, e.g., silicon dioxide, is formed as on a semiconductor substrate (not shown), and a conductive layer is formed thereon. The conductive layer depicted in FIG. 1 is a composite conductive layer comprising barrier metal layer 11, such as titanium, a primary metal layer 12, such as aluminum, and anti-reflective coating 13, such as titanium nitride. A photoresist mask 14 is formed on the composite conductive layer by conventional photolithographic techniques. The photoresist mask comprises an organic material and defines a pattern of lines to be formed in the composite conductive layer.

As shown in FIG. 2, the inadequate etch selectivity between photoresist mask 14 and the composite conductive layer comprising barrier metal layer 11, conductive metal layer 12 and anti-reflective coating 13, results in etching of the side surfaces of photoresist mask 14 altering its profile. It should be recognized that in FIGS. 1–7, similar elements bear similar reference numerals. Upon etching the composite conductive layer, the etch end point is detected and overetching is conducted to ensure complete removal of any reaction products and minimize bridging between the metal lines. As shown in FIG. 2, the profiled side surfaces of photoresist mask 14 undesirably cause a reduction of the width of the etched metal lines. This problem is exacerbated when employing relative thin photoresist masks, such as below about one micron for etching a composite conductive layer of 0.8 microns or thicker.

Hard masks have been proposed for use in defining a conductive pattern, such as a mask made of silicon dioxide, silicon nitride or silicon oxynitride. However, the use of a hard mask increases process complexity and, hence, increases the expected defect level. Moreover, the use of a hard mask increases manufacturing costs.

Nitrogen has previously been included in etch chemistry to improve etch selectivity with respect to a resist during etching and to provide slightly sloped metal profiles. The amount of nitrogen incorporated has been typically limited to less than 10% by volume of the total gas flow. Alternatively, nitrogen is employed only during the early etch sequence and cut off, in order to minimize nitrogen induced residues.

In copending application Ser. No. 08/359,232 filed on Dec. 19, 1994, a method is disclosed for etching a composite comprising a photoresist mask on an anti-reflective coating having a non-planar topography. In accordance with the disclosed method, the composite is etched using an inert gaseous nitrogen plasma to maintain the resist profile by increasing the selectivity of the anti-reflective coating vis-à-vis the photoresist during removal of a spin-on anti-reflective layer.

In copending application Ser. No. 08/554,413 filed on Nov. 8, 1995, a method is disclosed wherein an inert gas plasma, preferably containing nitrogen, is employed to etch an anti-reflective coating without any substantial etching of exposed underlying polysilicon.

In copending application Ser. No. 08/657,261 filed on Jun. 3, 1996, the metal etch rate of a conductive material within a dense array of conductive lines is increased by injecting nitrogen into the gas flow of the plasma during high density plasma etching.

There exist a need for semiconductor technology enabling etching a conductive layer, as by high density plasma etching, to form sub-half micron conductive line patterns without encountering a reduction in line width due to etching of the photoresist mask.

DISCLOSURE OF THE INVENTION

An object of the present invention is a method of manufacturing a semiconductor device, wherein a conductive layer is etched through a photoresist mask to accurately form a pattern of conductive lines with substantially no reduction in the designed line width.

Additional objects, advantages and other features of the invention will be set forth in part in the description which follows and in part will become apparent to those having ordinary skill in the art upon examination of the following or may be learned from practice of the invention. The objects and advantages of the invention may be realized and obtained as particularly pointed out in the appended claims.

According to the present invention, the foregoing and other objects are achieved in part by a method of manufacturing a semiconductor device having a pattern of conductive lines, which method comprises: forming an insulating layer; forming a conductive layer on the insulating layer; providing a photoresist mask on the conductive layer, which photoresist mask contains an organic material and defines a pattern of lines for forming the conductive pattern; forming a passivation coating on the surface of the mask; and etching the conductive layer through the mask containing the passivation coating to form the pattern of conductive lines.

Another aspect of the present invention comprises a method of manufacturing a semiconductor device having a pattern of conductive lines, which method comprises: forming an insulating layer; forming a conductive layer on the insulating layer; providing a photoresist mask on the conductive layer, which photoresist mask contains an organic material and defines a pattern of submicron lines for forming the conductive pattern; exposing the photoresist mask to a plasma containing nitrogen in an amount sufficient to form a passivation coating on the surface of the mask, wherein the passivation coating contains nitrogen; and etching the conductive layer through the mask containing the passivation coating to form the pattern of conductive lines; wherein, the passivation coating increases the resistance of the photoresist mask to etching during formation of the pattern of conductive lines.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

MODES FOR CARRYING OUT THE INVENTION

The present invention addresses and solves the reduction in conductive line width problem which occurs when etching a conductive layer, such as a metal layer, through a photoresist mask. As integration increases and the demand for conductive patterns having narrower conductive lines with smaller interwiring spacing increases accordingly the photoresist mask must be formed correspondingly thinner in order to provide a suitable process window, employing conventional photolithographic techniques and equipment. The inadequate etch selectivity with respect to conventional photoresist materials while etching an underlying metal layer results in an alteration of the profile of the desirable vertical side surfaces of the photoresist mask causing a narrowing the width of the resulting conductive lines below the design rule, thereby adversely affecting device performance.

In accordance with the present invention, a passivation coating is formed on the surface of the photoresist mask, including the side surfaces of the defined pattern of lines, which passivation coating increases the resistance of the photoresist mask to etching. Therefore, upon subsequent etching of the underlying conductive layer through the photoresist mask having the passivation coating thereon, the desirable substantially vertical side surfaces of the photoresist mask is substantially maintained, thereby substantially precluding narrowing of the resulting etched conductive lines below the design rule. Thus, the present invention provides an efficient, effective and economic technique to reliably form conductive lines having a width below 0.5 μm, even below 0.35 μm with dimensional accuracy. Advantageously, the present invention can be easily integrated into existing methodology employing existing photolithographic and etching equipment.

Figure 4:
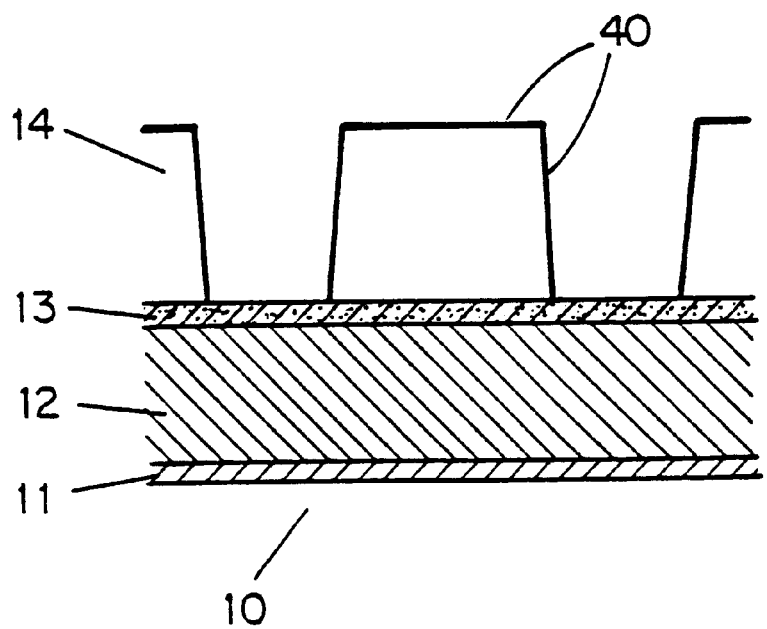
FIG. 4 illustrates a photoresist mask in accordance with the present invention.

In accordance with the present invention, as illustrated in FIG. 4, a passivation coating 40 is formed on the surface of the photoresist mask, including the side surfaces defining a pattern of lines. The passivation coating increases the resistance of the photoresist mask to etching during formation of the underlying conductive pattern.

In an embodiment of the present invention, the passivation coating contains nitrogen and is formed by exposing the photoresist mask to a plasma containing nitrogen. One having ordinary skill in the art can easily optimize the parameters for generating a nitrogen-containing plasma, and duration of exposure of the photoresist mask to form a suitable passivation coating. It has been found that a gas flow containing about 50 to about 100 volume percent of nitrogen, with or without an inert gas, is sufficient to generate a plasma suitable for forming a passivation coating on the surface of the photoresist mask. In practicing the present invention, a high density nitrogen plasma can be employed to form the passivation coating. The time required to form a passivation coating depends upon the particular photoresist material and plasma employed, and can easily be determined by one having ordinary skill in the art for a particular situation. Generally, it has been found that exposure of a photoresist mask to a high density plasma containing nitrogen for about 30 to about 300 seconds is sufficient to form an adequate passivation coating.

Upon subsequent etching of the underlying composite conductive layer, passivation coating 40 protects the surface of photoresist mask 14 from etching. Accordingly, the dimensional integrity of the width of the resulting conductive lines is accurately maintained.

Figure 1:
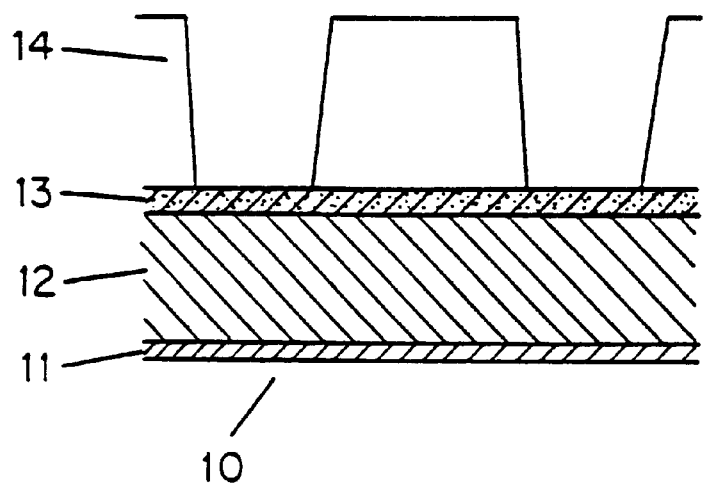
FIG. 1 schematically depicts a conventional photoresist mask on a metal layer.
Figure 2:
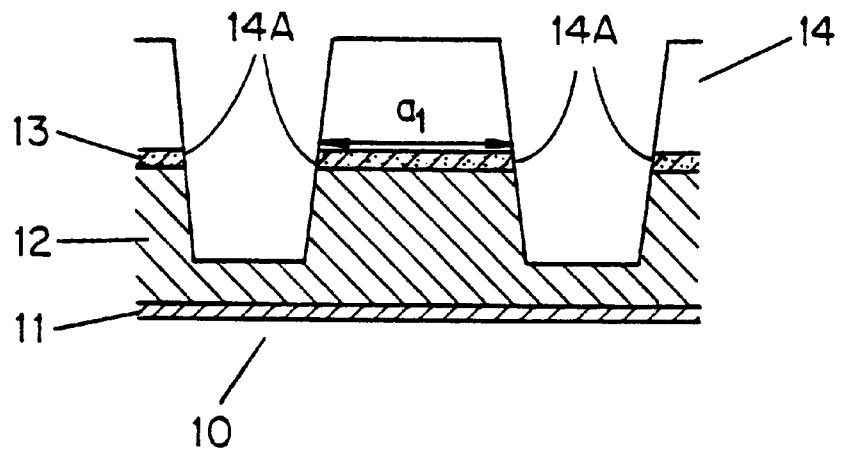
FIG. 2 illustrates a stage during a conventional etching technique.
Figure 5:
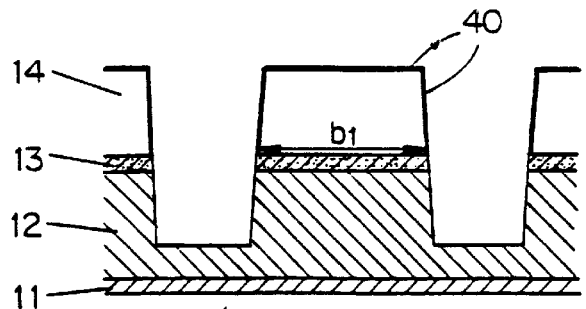
FIG. 5 illustrates a stage during etching in an embodiment of the present invention.

As shown in FIG. 5, the underlying composite conductive layer is etched. However, due to the presence of passivation coating 40, the width $b_1$ of the base of photoresist mask 14 is greater than the corresponding width $a_1$ at the base of photoresist mask 14 in the conventional method as shown in FIG. 2. Accordingly, the width at the top of the resulting metal line formed in accordance with the present invention is greater than the width at the top of the metal line formed in accordance with the conventional technique.

Figure 3:
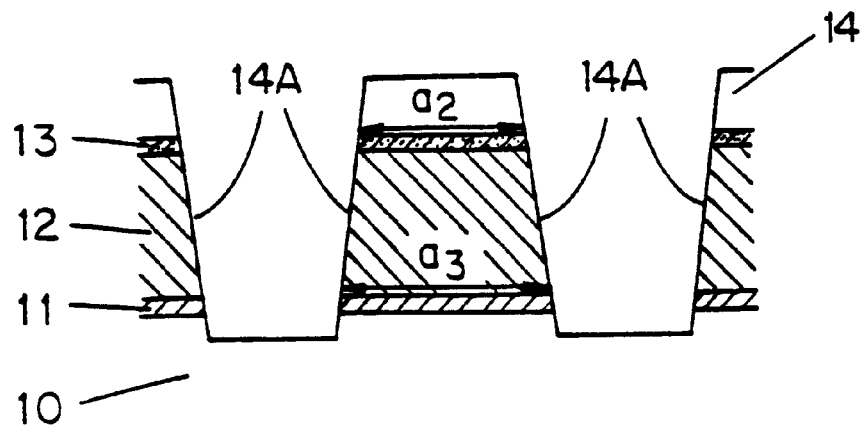
FIG. 3 illustrates the overetching stage of a conventional etching technique.
Figure 6:
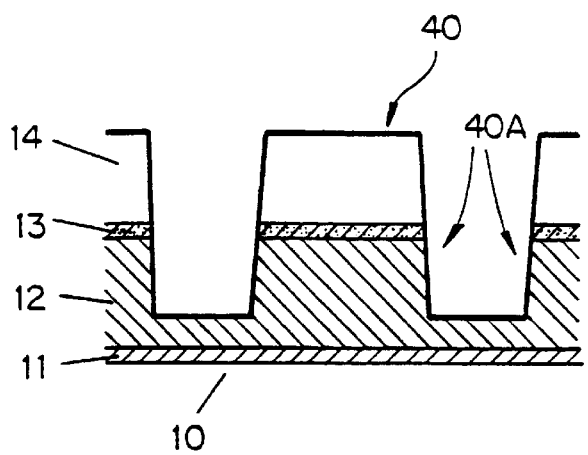
FIG. 6 illustrates a stage during etching in another embodiment of the present invention.
Figure 7:
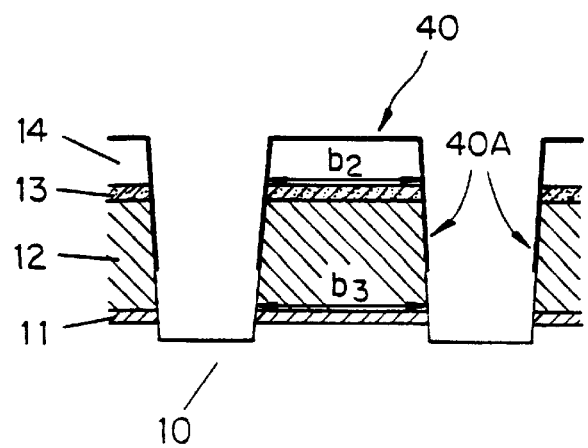
FIG. 7 illustrates the overetching stage in accordance with the present invention.

The etch end point upon etching the conductive layer is detected as in the conventional technique. However, in accordance with another embodiment of the present invention, prior to overetching, the photoresist mask and etched conductive layer are exposed to a second nitrogen-containing plasma, thereby providing a passivation coating 40A on the side surfaces of the etched composite conductive lines, as shown in FIG. 6. During subsequent overetching, the passivation coating on the side surfaces protect the composite conductive lines against etching, thereby preserving the designed dimensional integrity of the width of bottom of the composite conductive lines vis-à-vis that of conventionally formed composite conductive lines. Thus, the width $b_2$ of the top of the composite conductive lines and the width $b_3$ of the bottom of a composite conductive line formed in accordance with the present invention, as shown in FIG. 7, are greater than the corresponding widths $a_2$ and $a_3$ at the top and bottom of a conventionally formed composite conductive line, respectively, as shown in FIG. 3.

In an embodiment of the present invention, the passivation coating is formed on the photoresist mask in the same apparatus, e.g., etching tool, employed for etching the underlying conductive layer, thereby simplifying processing an increasing throughput. However, it is not necessary for the passivation coating to be formed in the same apparatus employed for subsequently etching the underlying conductive layer.

In another embodiment of the present invention, a pattern of conductive lines is formed by plasma etching, including high density plasma etching, an underlying conductive layer while nitrogen is introduced into the gas flow of the etching plasma. In another embodiment, the underlying conductive layer is plasma etched, including high density plasma etching, using an etching recipe with substantially no nitrogen.

The exact operative mechanism underlying the present invention is not known. However, it is believed that exposure of the photoresist mask to a nitrogen containing plasma results in the formation of a reaction product containing nitrogen and the organic material of the photoresist mask, which reaction product protects the surface of the photoresist from etching. Similarly, in the embodiment of the present invention wherein the side surfaces of the etched metal lines are exposed to a nitrogen-containing plasma prior to overetching, it is believed that a nitrogen-containing reaction product is formed which protects the side surfaces of the metal lines against etching during overetching of the underlying insulating layer.

Although the present invention has been exemplified by the use of a composite conductive layer comprising a barrier metal layer, primary metal layer and anti-reflective coating, the present invention is not limited with respect thereto. The present invention is applicable to the formation of a conductive pattern by etching a layer of any conductive material conventionally employed in the manufacture of semiconductor devices. The present invention is applicable to various layers formed by any conventional technique, such as chemical vapor deposition or physical vapor deposition. Thus, the conductive layer can be formed by conventional chemical vapor deposition or sputtering technique, and can comprise aluminum, aluminum alloys, such as an aluminum alloy containing titanium, copper and silicon, tungsten silicide or polycrystalline silicon. High density plasma chlorine etching to form the conductive pattern can be suitably performed, employing a conventional chlorine plasma etching equipment, such as Model 9600, commercially available from Lam Research Corp., Fremont, Calif.

Basically, the present invention can be practiced employing conventional methodology and conventional photolithographic and etching equipment, but departs from conventional practices by forming a passivation coating on the surface of a photoresist mask prior to etching an underlying conductive layer. The passivation coating protects the photoresist mask during subsequent etching of the underlying conductive layer, thereby enabling the accurate formation of conductive lines having sub-half micron geometry without any substantial narrowing of line width.

The present invention is applicable to the production of any of various types of semiconductor devices wherein a conductive pattern is formed, particularly a conductive pattern with sub-half micron dimensions. The present invention is applicable to various phases in the production of semiconductor devices comprising the formation of a pattern of conductive lines separated by interwiring spaces of less than about 0.5 µm, such as less than about 0.40 µm, and forming conductive lines less than about 0.5 µm in width.

Only the preferred embodiment of the invention and an example of its versatility is shown and described in the present disclosure. It is to be understood that the invention is capable of use in various other combinations and environments and is capable of changes or modifications within the scope of the inventive concept as expressed herein.

I claim:

1. A method of manufacturing a semiconductor device having a pattern of conductive lines, which method comprises:

forming an insulating layer over a semiconductor substrate;

forming a conductive layer on the insulating layer;

providing a photoresist mask on the conductive layer, which photoresist mask contains an organic material and defines a pattern of lines for forming the pattern of conductive lines;

prior to etching to form the pattern of conductive lines, exposing the photoresist mask containing the pattern of conductive lines to a plasma containing nitrogen in an amount sufficient to form a passivation coating on the surface of the photoresist mask, wherein the passivation coating contains nitrogen and increases the resistance of the mask to etching during formation of the pattern of conductive lines; and subsequently etching the conductive layer through the mask containing the passivation coating to form the pattern of conductive lines.

2. The method according to claim 1, comprising etching the conductive layer by high density plasma etching, wherein the passivation coating increases the resistance of the mask to high density plasma etching.

3. The method according to claim 2, comprising high density plasma etching the conductive layer with a plasma containing nitrogen.

4. The method according to claim 2, comprising high density plasma etching the conductive layer with a plasma containing substantially no nitrogen.

5. The method according to claim 1, wherein the passivation coating is formed by exposing the photoresist mask to a plasma formed from a gas flow containing nitrogen in an amount of about 50 to about 100 volume percent of the total gas flow.

6. The method according to claim 1, comprising exposing the photoresist mask to a high density plasma containing nitrogen in an amount sufficient to form the passivation coating.

7. The method according to claim 1, comprising exposing the photoresist mask to the plasma containing nitrogen and etching the conductive layer in the same apparatus.

8. The method according to claim 1, comprising exposing the photoresist to the plasma containing nitrogen in a first apparatus and etching the conductive layer in a second apparatus different from the first apparatus.

9. The method according to claim 1, wherein the conductive layer comprises a metal.

10. The method according to claim 9, wherein the conductive metal comprises aluminum or an aluminum-alloy.

11. The method according to claim 10, wherein the conductive metal comprises an aluminum-alloy containing copper.

12. The method according to claim 9, further comprising forming the conductive layer by depositing a barrier metal layer on the insulating layer, and depositing a primary metal layer on the barrier metal layer.

13. The method according to claim 12, wherein the barrier metal layer comprises titanium.

14. The method according to claim 12, further comprising depositing an anti-reflective coating on the primary metal layer.

15. The method according to claim 14, wherein the anti-reflective coating comprises titanium nitride.

16. The method according to claim 15, wherein the barrier metal layer comprises titanium and the primary metal comprises aluminum or an aluminum-alloy.

17. The method according to claim 1, wherein the insulating layer comprises an oxide.

18. The method according to claim 1, wherein the conductive lines have a width no greater than about 0.5 microns and an interwiring spacing no greater than about 0.5 microns.

19. The method according to claim 1, further comprising detecting an etch end point of etching through the underlying conductive layer;

exposing the etched conductive layer to a plasma containing nitrogen to form a passivation coating on side surfaces of the etched metal lines; and overetching; wherein, the passivation coating on the side surfaces protects the metal lines from etching during overetching.

* * * * *